(12) United States Patent
Duerk et al.

(10) Patent No.: US 9,069,050 B2
(45) Date of Patent: Jun. 30, 2015

(54) VARYING BLIPPED TRAJECTORY IN MRI

(76) Inventors: Jeffrey Duerk, Avon Lake, OH (US); Mark Griswold, Shaker Heights, OH (US); Daniel Neumann, Wuerzburg (DE); Charlie Yi Wang, Cleveland, OH (US)

( * ) Notice: Subject to any disclaimer, the term of this patent is extended or adjusted under 35 U.S.C. 154(b) by 571 days.

(21) Appl. No.: 13/444,887

(22) Filed: Apr. 12, 2012

(65) Prior Publication Data

US 2013/0271131 A1    Oct. 17, 2013

(51) Int. Cl.
*G01R 33/561* (2006.01)
*G01R 33/48* (2006.01)

(52) U.S. Cl.
CPC .......... *G01R 33/4824* (2013.01); *G01R 33/561* (2013.01)

(58) Field of Classification Search
USPC .......................... 324/300–322; 600/407–435; 382/128–131
See application file for complete search history.

(56) References Cited

U.S. PATENT DOCUMENTS

| | | | | |
|---|---|---|---|---|
| 4,536,711 A * | 8/1985 | King et al. | ..................... | 324/306 |
| 5,105,152 A * | 4/1992 | Pauly | ............................. | 324/309 |
| 5,258,711 A * | 11/1993 | Hardy | ........................... | 324/309 |
| 6,476,607 B1 * | 11/2002 | Dannels et al. | ............... | 324/309 |
| 7,466,131 B1 * | 12/2008 | Xu et al. | ........................ | 324/318 |
| 8,427,147 B2 * | 4/2013 | Block et al. | ................... | 324/309 |
| 8,664,954 B2 * | 3/2014 | Hetzer et al. | .................. | 324/309 |
| 2009/0091322 A1 * | 4/2009 | Posse | ............................ | 324/307 |
| 2010/0256480 A1 * | 10/2010 | Bottomley et al. | ........... | 600/411 |
| 2010/0260397 A1 * | 10/2010 | Block et al. | .................... | 382/131 |
| 2012/0013336 A1 * | 1/2012 | Hetzer et al. | ................. | 324/309 |
| 2013/0271131 A1 * | 10/2013 | Duerk et al. | .................. | 324/309 |

* cited by examiner

*Primary Examiner* — Melissa Koval
*Assistant Examiner* — Tiffany Fetzner

(57) ABSTRACT

Apparatus, methods, and other embodiments associated with magnetic resonance imaging (MRI) blipped trajectories having varying blip amplitudes are described. One example method includes controlling an MRI apparatus to produce a set of blipped trajectories including a first blipped trajectory having a first blip amplitude and a second, different blipped trajectory having a second, different blip amplitude. The blip amplitudes may be based on a relationship between a trajectory and a reference. The relationship may be, for example, a rotation angle. The rotation angle may be a proxy for information including a gradient trajectory speed associated with a blipped trajectory or an amount of unused gradient energy available while producing the blipped trajectory. The blip amplitudes may be selected to produce incoherent sampling during an MRI acquisition that uses the blipped trajectories. In one example, readout directions may be altered between trajectories to reduce regularity in k-space.

16 Claims, 16 Drawing Sheets

VARYING BLIPPED TRAJECTORY IN MRI

BACKGROUND

Blipped trajectories have been, tried, with limited success, in MRI. Magnetic resonance imaging (MRI) sequences are characterized by both radio frequency (RF) pulses and time-varying gradient magnetic fields. RF pulses are used to align resonant nuclei to facilitate generating a measurable signal. Gradient fields are used to spatially encode signals so that signals coming from one excited location can be distinguished from signals coming from another location. The signals are collected and mapped into an array. The array may be referred to as a "k-space" array. K-space represents the spatial frequency content of the imaged object. MRI gradient fields determine the location in the k-space array for a data point. The order in which k-space points are acquired is determined by a k-space trajectory. One type of k-space trajectory is a blipped trajectory. Some blipped trajectories are illustrated in FIG. 1.

MRI involves controlling gradients to produce specific magnetic fields at specific locations at specific times. While gradients can be turned on and off, there are limits on how quickly the gradients can be turned on and off. Therefore much attention has been paid to how and when to manipulate gradients to produce useful, efficient trajectories through k-space. The efficiency becomes more important as shorter and shorter acquisition times are sought in MRI.

In a basic example, consider a two dimensional rectangular slice as illustrated in FIG. 2. The rectangular slice 100 can be divided logically into a set of regions that may be referred to as pixels or voxels. FIG. 2 illustrates slice 100 divided into pixels P1 through P25. Slice 100 can be seen to lie in an X-Y plane as indicated.

One conventional rectilinear trajectory creates conditions in the pixels P1 through P25 in order by changing the X gradient to move from P1 to P2 to P3 to P4 to P5 and then changing the Y gradient to move from P5 to P6 and then changing the X gradient to move from P6 to P7 to P8 to P9 to P10 and then changing the Y gradient to move from P10 to P11, and so on until all twenty five pixels have been traversed. This simple rectilinear trajectory is intuitively obvious and attractive. However, in some cases, this simple rectilinear trajectory may produce sub-optimal results in MRI. The sub-optimal results may be associated with, for example, how long it takes to sample the entire rectangle 100, how frequently the center of k-space is visited, interference from neighboring pixels, and other factors. The sub-optimal results may also be associated with, for example, the regularity in k-space between pixel acquisitions when signal is acquired sequentially from one pixel and then from a neighboring pixel using substantially similar conditions.

Therefore, non-rectilinear trajectories (e.g., radial, spiral) have been developed. These trajectories have been employed to support recent acquisition strategies (e.g., compressed sensing) associated with acquiring signals from moving objects. Imagine photographing a moving object (e.g., spiked volleyball). If you have a camera with a slow shutter speed and slow film, the spiked volleyball will be a blur. But if you have a camera with a faster shutter speed, the volleyball may be more clear. If you have a camera with a fast enough shutter and fast enough film, you may even be able to freeze the spiked volleyball in mid-flight. In photography, the image clarity of a moving object is directly related to "shutter speed".

In MRI, to improve the imaging of moving objects (e.g., heart, blood), it may also be desirable to have a faster "shutter speed", which is achieved by reducing the amount of time that it takes to acquire signal from the moving object. One way to reduce the amount of time that it takes to acquire signal is to perform rapid incoherent sampling using, for example, a compressed sensing approach.

Signal processing has generally accepted the assumption that a signal should be sampled at a rate of at least twice its highest frequency in order to be represented without error. However, this assumption may not be valid in some cases. Additionally, the assumption may lead to unnecessarily high sampling rates in some cases. Consider that much signal processing involves compressing data soon or immediately after sensing. The compression balances signal representation complexity against error. If a signal is going to be compressed immediately after sensing anyway, then it may not make sense to perform the full sensing. Instead, a compressed sensing may make sense.

Compressed sensing may involve sampling a signal at a reduced rate and performing compression soon after sampling. In MRI, the number of measurements taken is proportional to the scan time. Reducing the number of points sampled, as occurs in compressed sampling, reduces the scan time. However, reducing the number of points sampled leaves "holes" in the sampled data. The holes may be filled by extrapolating missing sample points from acquired sample points to produce a full data set from which an image can be made. Missing samples can be extrapolated by enforcing sparseness in a transform. However, the under-sampling may produce under-sampling artifacts.

Compressed sensing may rely on redundancy in signals. One useful redundancy exists when a signal is sparse, meaning that the signal has many coefficients close to or equal to zero when represented in some domain. Incoherent sampling seeks to have under-sampling artifacts be incoherent within the object so that they appear more like noise and less like signal. While there has been some success in incoherent sampling in three dimensions (3D), there has been less success in incoherent sampling in two dimensions (2D), particularly in compressed sensing approaches. Since MRI apparatus are frequently configured to acquire 2D "slices", some MRI apparatus may have sub-optimal results when attempting incoherent sampling with compressive sensing.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
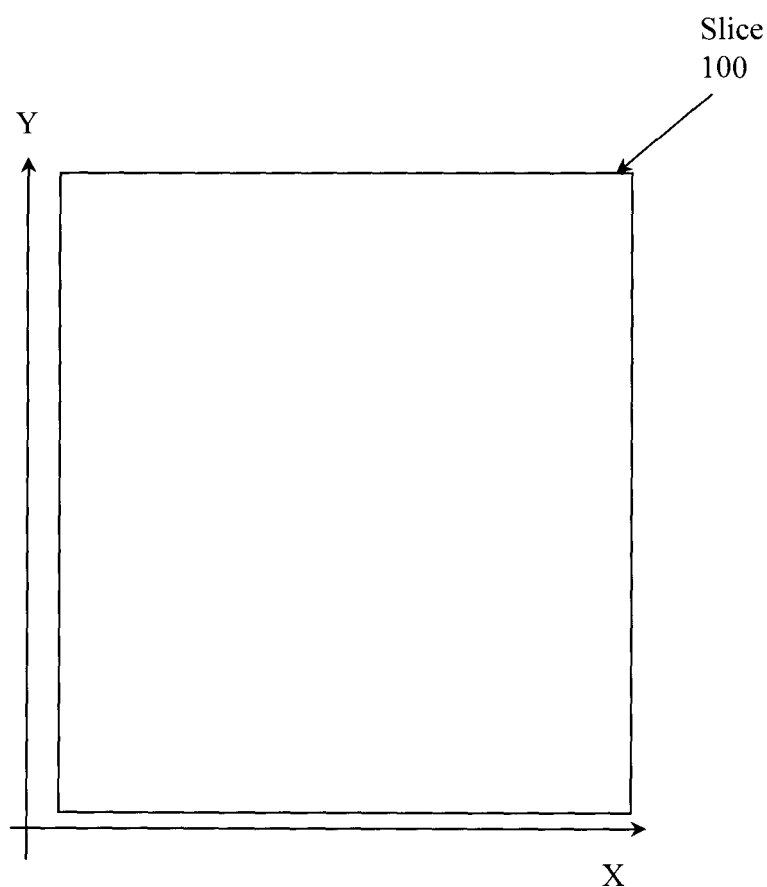
FIG. 1 illustrates some example blipped trajectories.
Figure 16:
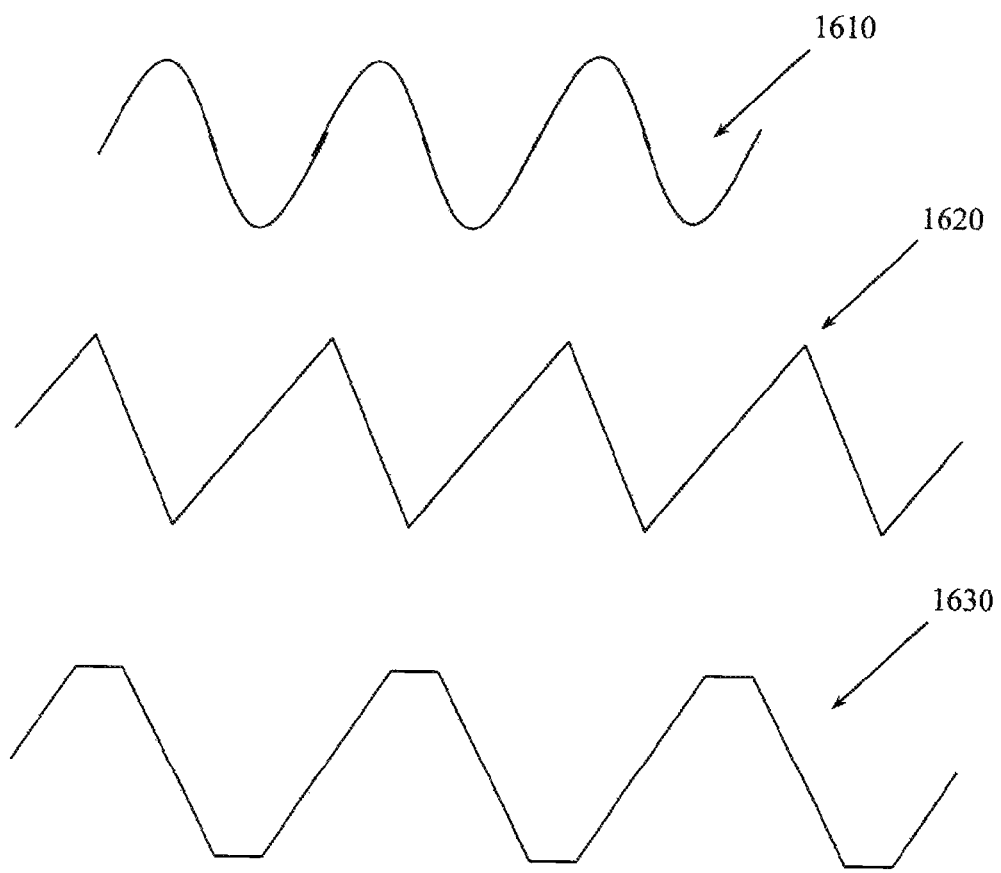
FIG. 16 illustrates an example blipped trajectory and a corresponding non-blipped trajectory.

Example apparatus and methods control an MRI apparatus to produce a set of blipped trajectories having varying blip amplitudes. A "blipped" trajectory may refer to, for example, a zigzag path, a sinusoidal path, a sharks-tooth path, or paths. Different example blipped trajectories (e.g., 10, 20, 30) are illustrated in FIG. 1. While three symmetric blipped trajectories are illustrated, one skilled in the art will appreciate that different blipped trajectories, including non-symmetric trajectories, can be produced. In one example, the blipped trajectory is produced using blipped gradients with blip amplitudes that vary with the angle $\phi$ (Phi) by which a trajectory is rotated away from a reference point. Varying amplitude with respect to a rotation angle is practical because the rotation angle may be a useful proxy for information like a gradient trajectory speed or available unused gradient energy. FIG. 16 illustrates a blipped trajectory 1600 and a corresponding non-blipped trajectory 1610.

To the extent that blipped trajectories have been employed in MRI, the conventional blipped trajectories have had a constant blip magnitude and thus trajectory amplitude for each projection or line in an acquisition. While the conventional approaches may have provided some utility in three dimensional acquisition, varying the blip amplitude with respect to a rotation angle (e.g., $\phi$) may provide improved k-space coverage even in two dimensions. Improving k-space coverage may in turn improve a point-spread function that can be achieved in a radial, spiral, radial-like, or other non-rectilinear acquisitions.

Recall that gradient fields are produced by manipulating the current in a gradient coil. There are physical limits to how quickly a gradient field can be manipulated. One of these limits is described by the gradient slew rate. The slew rate describes the rate of ascent or descent of a gradient from zero to its maximum amplitude. Having a faster slew rate allows the gradient to slew from zero to its maximum amplitude in less time, which in turn facilitates having faster gradients and shorter echo spacing. Another of these limits is described by the gradient strength. Gradient strength refers to the maximum amplitude of the gradient field. Example apparatus and methods may be configured to produce more optimal MRI scanning results by operating the gradient system at or near its limits. By way of illustration, a gradient coil may be controlled to produce a field that changes from zero to its maximum amplitude at the maximum rate possible.

Figure 2:
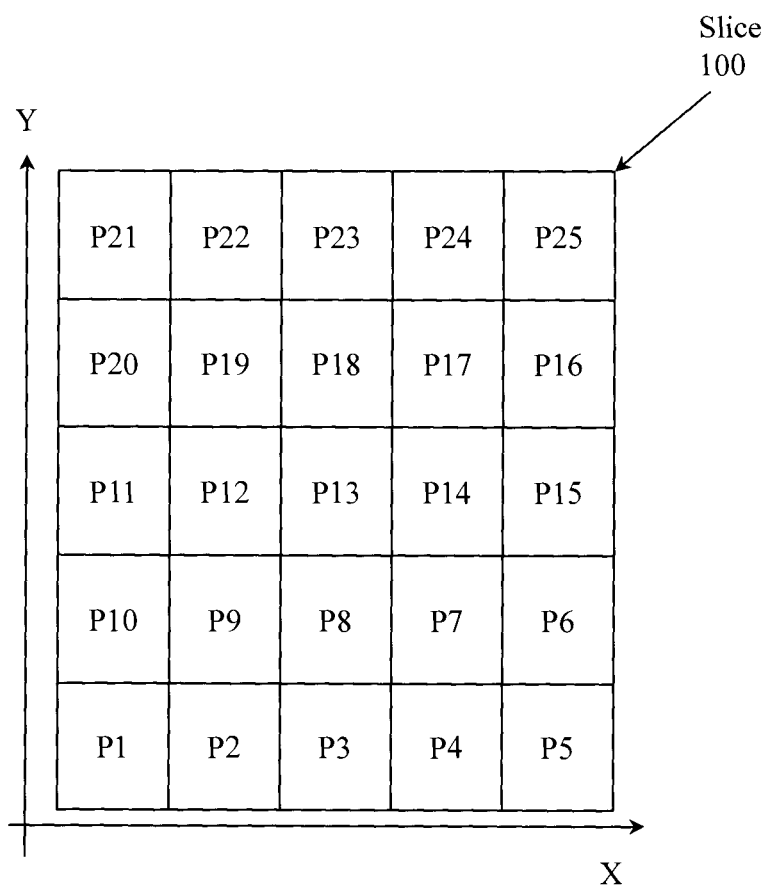
FIG. 2 illustrates a rectangle in an X-Y plane, where the rectangle has been divided into 25 pixels.

Recall the rectilinear trajectory described in FIG. 2. As the trajectory moves along the X-axis, the Y gradient may be held constant. Then, as the trajectory moves along the Y-axis, the X gradient may be held constant. This may be inefficient because there is gradient energy available that is not being employed. Additionally, while moving along the X-axis, the X-gradient may be manipulated by a constant amount to move between adjacent pixels. Once again, gradient energy may be available and unused. Wasting gradient energy by moving in small steps and by moving in only a single direction may lengthen acquisition times or lead to other inefficiencies.

Figure 3:
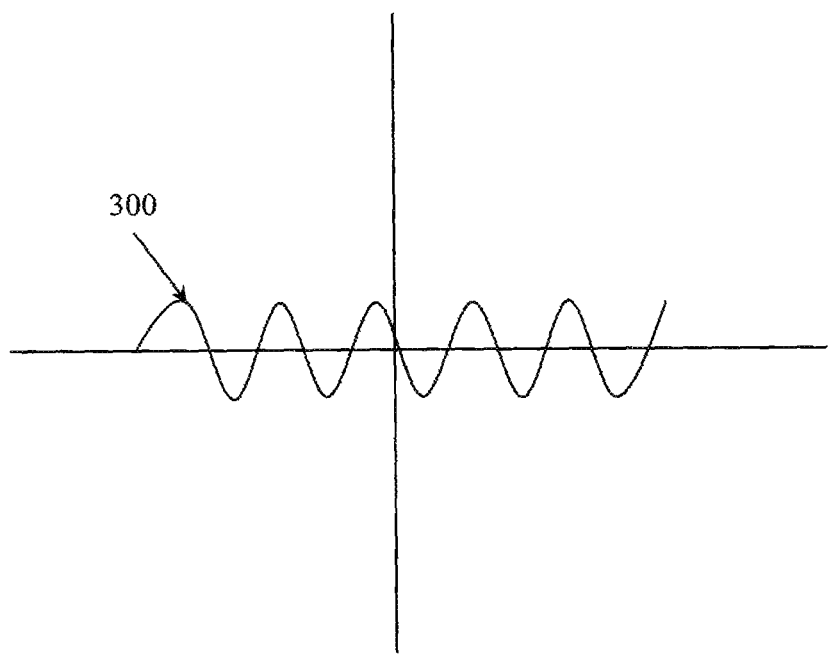
FIG. 3 illustrates a single blipped trajectory.
Figure 4:
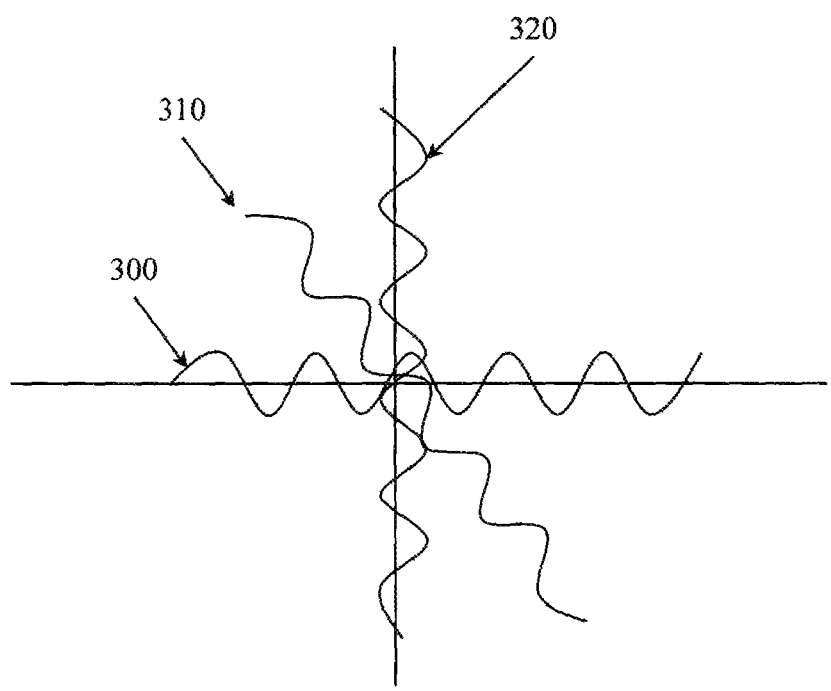
FIG. 4 illustrates a set of blipped trajectories having a constant amplitude.
Figure 5:
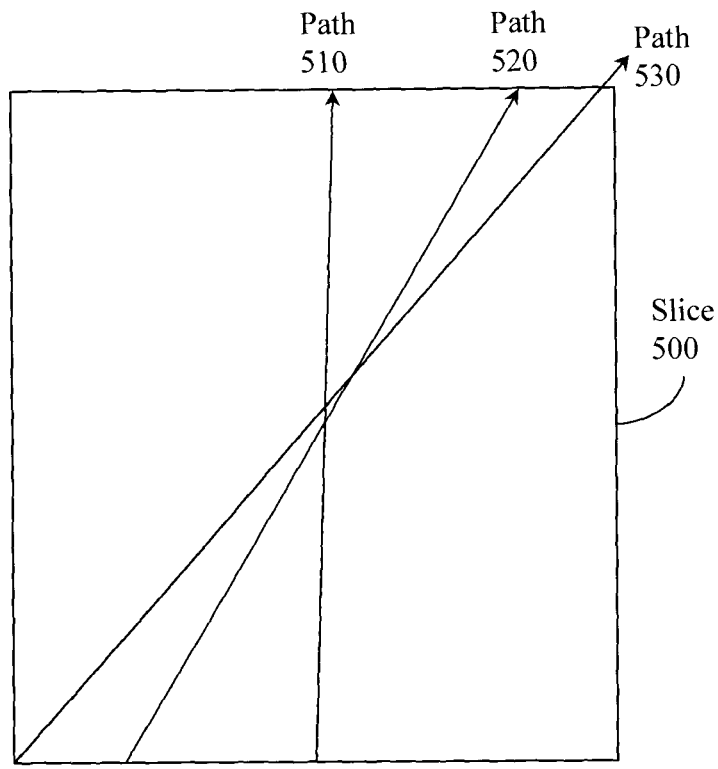
FIG. 5 illustrates three different paths through a rectangle.

FIG. 3 illustrates a single blipped trajectory 300. Note that the trajectory 300 has constant amplitude. FIG. 4 illustrates a set of blipped trajectories including trajectories 300, 310, and 320. Once again, all the trajectories have constant amplitudes. While the rectilinear trajectory in FIG. 2 would sample every pixel in a slice, the blipped trajectories in FIG. 4 may undersample the slice. FIG. 4 shows that the three lines 300, 310, and 320 all pass through the center of k-space and thus the center may be less under-sampled than other regions.

Like the initial rectilinear trajectory in FIG. 2 may have been intuitively attractive, obvious, and straightforward to implement, the trajectories illustrated in FIG. 4 may also be intuitively attractive, obvious, and straightforward to implement. However, this initial set of trajectories may be improved by examining how the gradient system works and then by driving the gradient system closer to its limits in light of the physical realities of the gradient system operation. Driving the gradient system closer to its limits may yield more optimal incoherent sampling in MRI, even in compressed sensing applications.

Understanding the gradient system operation is facilitated by returning to the rectangle. Rectangle 500 represents a slice in an MRI acquisition. Three paths are drawn through rectangle 500. Path 510 is the shortest path through the rectangle. Path 530 is the longest straight path through the rectangle. Path 520 is in between the shortest path 510 and the longest path 530. Travelling path 510 through slice 500 only requires manipulating the Y gradient. This leaves X gradient energy available and unused. Travelling path 520 requires manipulating both the X and the Y gradient, although the Y gradient will be manipulated more than the X gradient. Some X gradient energy and some Y gradient energy may be unused and available when following path 520. Travelling path 530 requires manipulating both the X and Y gradients in equal amounts. There may be little or no gradient energy unused and available when following path 530.

As described earlier, the rate at which the gradient fields can be changed depends on and is limited by the switching rate of the gradient coils. Imagine now that there is one equal unit of time to cross rectangle 500 by travelling along each of paths 510, 520, and 530. Since path 510 is the shortest and path 530 is the longest, given an equal amount of time to cross the rectangle 500, a trajectory could move more slowly along path 510 than it could along path 530. The trajectory would have to move more quickly along path 520 than it would on path 510, but could move more slowly on path 520 than it could on path 530.

Said another way, path 530 is the fastest gradient trajectory because it is the longest trajectory through rectangle 500 and path 510 is the slowest gradient trajectory because it is the shortest trajectory through rectangle 500. The fastest gradient path has the least amount of unused gradient energy available while the slowest gradient path has the greatest amount of unused gradient energy available.

Figure 6:
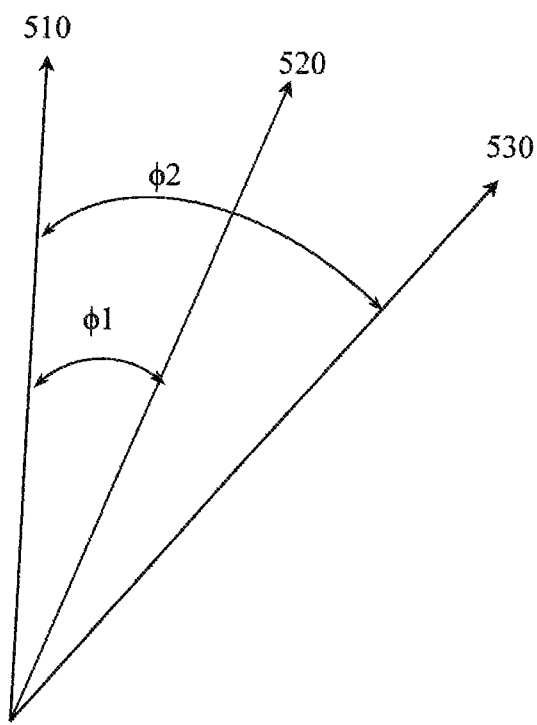
FIG. 6 illustrates rotation angles associated with three paths through a rectangle.

FIG. 6 illustrates portions of the paths 510, 520, and 530 as they extend outwards from an origin. Path 510 lies on the Y axis and thus its angle of rotation φ away from the Y axis is zero. Path 520 lies away from the Y axis and its angle of rotation is φ1. Path 530 lies even farther away from the Y axis and thus its angle of rotation is φ2, where φ2>φ1. Path 510 is the slowest trajectory and has the most unused X gradient energy. Path 520 is the middle trajectory and has unused X and Y gradient energy. Path 530 is the fastest trajectory and has the least, if any, unused X and Y gradient energy. This demonstrates the relationship between rotation angle, gradient trajectory speed, and unused gradient energy.

Seen from a different point of view, path 530 could be seen as the "center" line or diagonal path, path 520 could be seen as being rotated a first angle away from the diagonal path, and path 510 could be seen as being rotated a second, greater angle away from the diagonal path.

Example apparatus and methods rely, at least in part, on understanding the effects of different trajectory speeds on unused and available gradient energy to produce blipped trajectories with varying amplitudes. In one embodiment, the amplitudes vary with the angle of rotation φ away from a diagonal. In another example, the amplitude varies with the amount of unused and available gradient energy.

Figure 7:
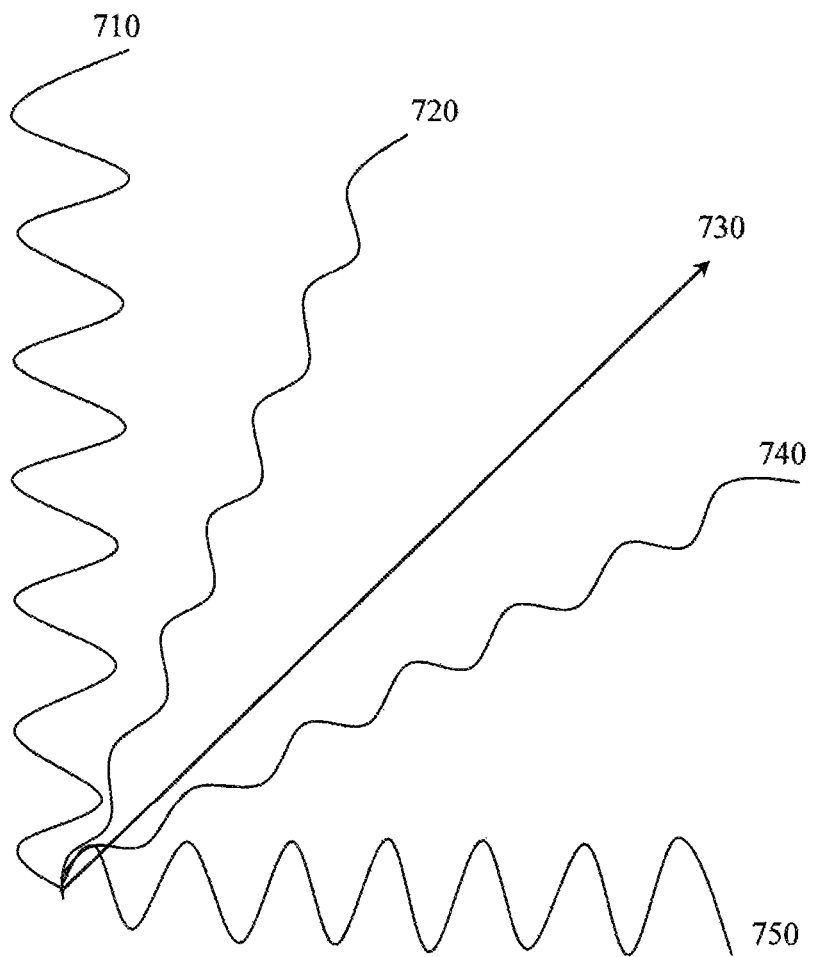
FIG. 7 illustrates five blipped trajectories having non-constant amplitudes.

FIG. 7 illustrates five trajectories that form a portion of a blipped trajectory acquisition. Trajectory 710 lies along the y axis, trajectory 730 lies along the X-Y diagonal and trajectory 720 lies in between trajectories 710 and 730. Trajectory 750 lies along the X axis and trajectory 740 lies in between diagonal 730 and shortest path 750. Since trajectory 710 lies along the Y axis, it is a slowest gradient trajectory and has the most untapped X gradient energy. Therefore trajectory 710 may be configured to zigzag back and forth with an amplitude $A_{710}$. Since trajectory 750 lies along the X axis, it is also a slowest gradient trajectory and has the most untapped Y gradient energy. Therefore trajectory 750 may be configured to zigzag back and forth with an amplitude $A_{750}$. $A_{750}$ may be equal to or substantially equal to $A_{710}$. $A_{710}$ and $A_{750}$ may be the maximum amplitudes for blipped trajectories.

Since line 730 lies along the diagonal, it is the fastest gradient trajectory and has the least untapped gradient energy. Therefore line 730 may be straight or substantially straight. Seen from one point of view, line 730 zigzags back and forth with an amplitude $A_{730}=0$. $A_{730}$ may be the minimum amplitude for a blipped trajectory. Line 720 is in between lines 710 and 730. Trajectory 720 is faster than line 710 but slower than line 730. Therefore, line 720 is shown zigzagging back and forth with an amplitude $A_{720}$, where $A_{710}>A_{720}>A_{730}$. Similarly, line 740 lies in between lines 730 and 750 and has an amplitude $A_{740}$, where $A_{730}<A_{740}<A_{750}$.

In FIG. 7 the zigzag amplitudes are illustrated depending on and varying directly with the angle of rotation away from a diagonal. Once a trajectory has rotated more than 45 degrees away from a diagonal it is on an axis and has reached its maximum blip amplitude. The relationship between rotation angle and blip amplitude is determined, at least in part, on the amount of untapped and available gradient energy. When a line is on a diagonal, there may be little to no untapped gradient energy. When a line is on an axis, there may be a maximum amount of untapped gradient energy. Thus, in one example, the blip amplitude is zero or near zero along the diagonal projections and the blip amplitude is at its maximum along the axial projections (e.g., along X axis, along Y axis). In this example, the blip amplitude varies based on the angle between the blip trajectory and a reference line (e.g., diagonal, fastest gradient path). In another example, the blip amplitude may vary based on the area in k-space being covered. In one example, to avoid having a completely straight trajectory along a diagonal, the acquisition time may be lengthened to allow the amplitude of the zigzag along the diagonal to be greater than zero. Varying the blip amplitude facilitates producing incoherent sampling, even in a 2D scan. The incoherent sampling is achieved while maintaining desired gradient performance. FIG. 7 illustrates that a trajectory may have a fast axis and a slow axis. The slow axis may be the main direction of travel for the trajectory. The fast axis may be perpendicular to the slow axis and the rate of travel along the fast axis may be faster than the rate of travel along the slow axis. Additionally, the gradient along the fast axis will oscillate. In this framework, the "blip amplitude" refers to the magnitude of the gradient oscillations on the fast axis. By way of illustration, on line 730, the rate of travel is equal and there is no oscillation. On line 750, the rate of travel is unequal, the slow axis is the x axis, and the fast axis is the y axis. Thus, the fast axis is perpendicular to the slow axis and the gradient oscillates with a blip amplitude along the fast axis. On line 740, the slow axis is along the direction of the line 740, but because there is less unused gradient strength along the direction perpendicular to this direction, the blip amplitude is less than the blip amplitude on line 750.

In yet another example, consecutive readout lines may be acquired using different readout directions. For example, a first readout line (e.g., 710) may be acquired using a first readout direction (e.g., bottom to top, inside to outside, travelling away from origin) while a second readout line (e.g., 720) may be acquired using a second readout direction (e.g., top to bottom, outside to inside, travelling towards origin). Varying the readout direction for consecutive lines may contribute to decreasing regularity in k-space. While consecutive lines have been described, readout directions may be varied for different relationships between lines in an acquisition.

While 2D examples have been described, example apparatus and methods may also vary blip amplitude for blip lines in a 3D acquisition. Similarly, while a rectangle has been described, example apparatus and methods may produce blipped trajectories in non-rectangular areas or in non-cubic volumes.

Figure 8:
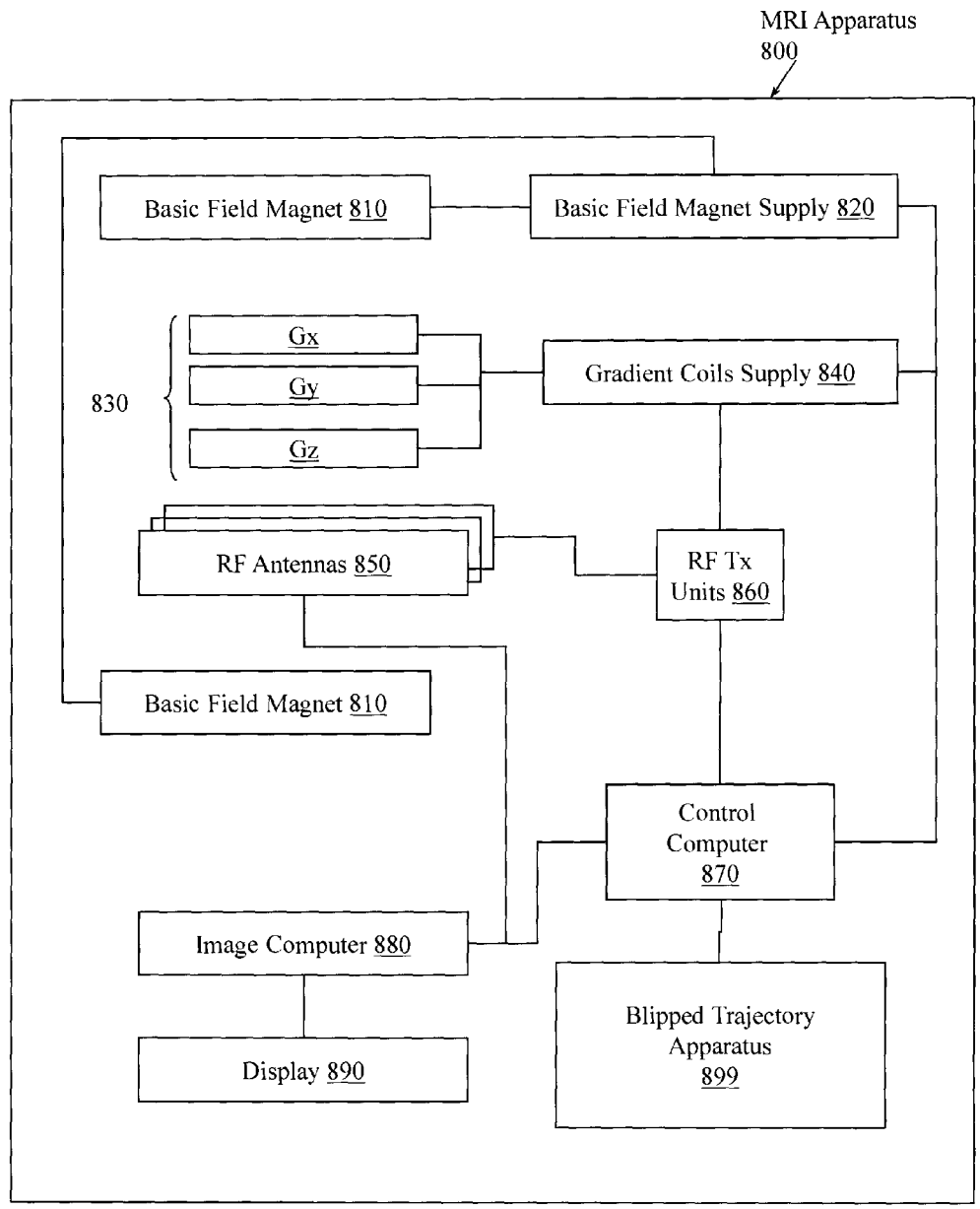
FIG. 8 illustrates an MRI apparatus configured to produce a set of blipped trajectories.

FIG. 8 illustrates an example MRI apparatus 800 configured with an apparatus 899 to control production of a set of blipped trajectories. The apparatus 899 may be configured with elements of example apparatus described herein and/or may perform example methods described herein. In one example, apparatus 899 may provide means for selectively varying the amplitude of a blipped trajectory associated with an MRI acquisition. In one example the amplitude is based, at least in part, on a trajectory speed and an available gradient energy.

The apparatus 800 includes a basic field magnet(s) 810 and a basic field magnet supply 820. Ideally, the basic field magnets 810 would produce a uniform $B_0$ field. However, in practice, the $B_0$ field may not be uniform, and may vary over an object being imaged by the MRI apparatus 800. MRI apparatus 800 may include gradient coils 830 configured to emit gradient magnetic fields like $G_S$, $G_P$ and $G_R$ or Gx, Gy, and Gz. The gradient coils 830 may be controlled, at least in part, by a gradient coils supply 840. In some examples, the timing, strength, and orientation of the gradient magnetic fields may be controlled, and thus selectively adapted, during an MRI procedure.

MRI apparatus 800 may include a set of RF antennas 850 that are configured to generate RF pulses and to receive resulting nuclear magnetic resonance (NMR) signals from an object to which the RF pulses are directed. In one embodiment, the RF antennas 850 are arranged as an array of parallel transmission coils that are individually controllable. How the pulses are generated and how the resulting magnetic resonance (MR) signals are received may be controlled and thus may be selectively adapted during an MR procedure. Separate RF transmission and reception coils can be employed. The RF antennas 850 may be controlled, at least in part, by a set of RF transmission units 860. An RF transmission unit 860 may provide a signal to an RF antenna 850. The RF transmission unit 860 may provide different signals to different RF antennas to produce different RF excitations from the different members of the array of parallel transmission coils.

The gradient coils supply 840 and the RF transmission units 860 may be controlled, at least in part, by a control computer 870. In one example, the control computer 870 may be programmed to control an NMR device as described herein. Conventionally, the magnetic resonance signals received from the RF antennas 850 can be employed to generate an image and thus may be subject to a transformation process like a two dimensional fast Fourier transform (FFT) that generates pixilated image data. The transformation can be performed by an image computer 880 or other similar processing device. The image data may then be shown on a display 890.

While FIG. 8 illustrates an example MRI apparatus 800 that includes various components connected in various ways, it is to be appreciated that other MRI apparatus may include other components connected in other ways.

Figure 9:
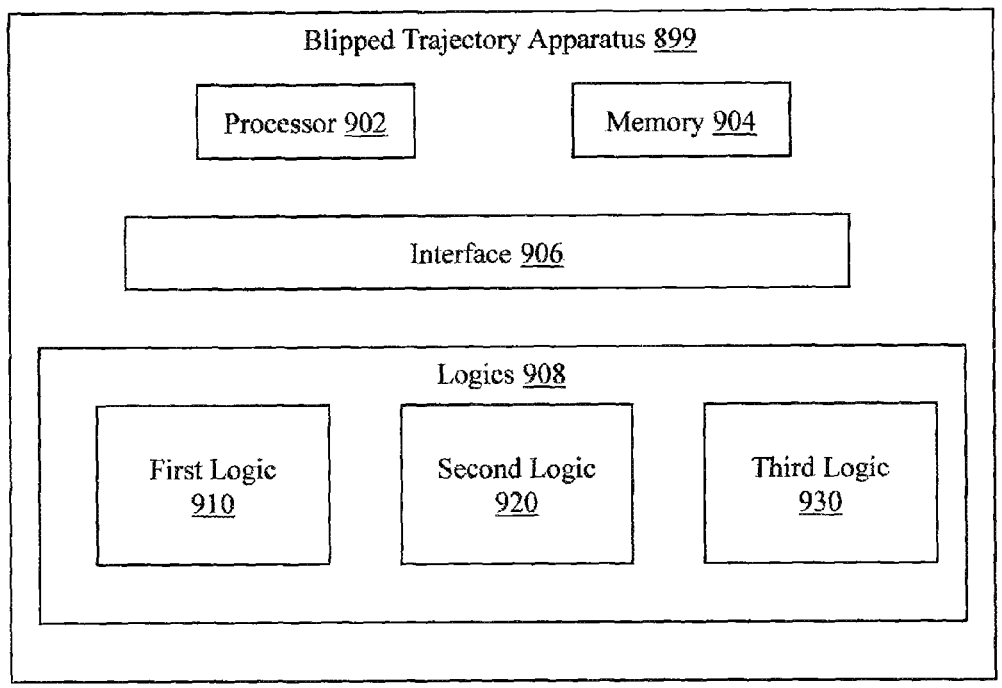
FIG. 9 illustrates an apparatus configured to produce a set of blipped trajectories.

FIG. 9 illustrates one embodiment of a blipped trajectory apparatus 899. In one embodiment, apparatus 899 includes a processor 902, a memory 904, and a set 908 of logics operably connected to the processor 902 and the memory 904 by an interface 906. In one embodiment, the set 908 of logics includes a first logic 910, a second logic 920, and a third logic 930. In one embodiment, when the set 908 of logics are implemented as circuits, apparatus 899 may not include the processor 902, memory 904, or interface 906.

In one embodiment, the first logic 910 may be configured to control a gradient system for an MRI apparatus. Controlling the gradient system may include, for example, controlling when gradients are turned on and off, controlling the slew rate for a gradient, controlling the maximum field strength produced, coordinating different gradient fields produced by different gradient coils (e.g., Gx, Gy, and Gz), and other actions.

In one example, the first logic 910 controls the gradient system to produce a set of blipped trajectories that may be used in an MRI acquisition. Recall that the blipped trajectories are produced by gradient fields and that MRI systems control both gradient fields and RF energy. The gradient fields are used to create conditions that control excitation produced by the RF energy. Thus, the selection of which regions in a sample will produce NMR signals in response to applied RF is controlled by the blipped trajectories.

In one embodiment, the first logic 910 is configured to produce a first blipped trajectory having a first blip amplitude and a second blipped trajectory having a second, different blip amplitude. While two blipped trajectories with two different blip amplitudes are described, a greater number of trajectories with a greater number of amplitudes may be employed. The blipped trajectories may be derived from, for example, a radial trajectory, a spiral trajectory, or other trajectory.

Different blipped trajectories can have different amplitudes. Thus, in one example, the first logic 910 determines the amplitudes for the members of the set of blipped trajectories. In one example, a blipped trajectory may even have different amplitudes during the single trajectory. For a radial projection that extends along a ray from an origin to an edge of a sample, the amplitude may be constant throughout the projection. But for a spiral projection that extends along a curved path from the origin to the edge, the amplitude may vary within the spiral projection. The amplitudes may be determined based on factors including, but not limited to, a gradient trajectory speed for a projection, a gradient trajectory speed for a portion of a projection, an amount of unused gradient energy available for a projection, an amount of unused gradient energy available for a portion of a projection, a relationship between a projection and a reference line or point, a relationship between a portion of a projection and reference line or point, or on other information.

In one embodiment, the second logic 920 may be configured to control the acquisition of NMR signals that are produced in response to nuclear magnetic excitation associated with the set of blipped trajectories. Since second logic 920 can control NMR signal acquisition, apparatus 899 may also include third logic 930 that is configured to produce an image from the NMR signals.

In one example, the first logic 910 may be configured to determine readout directions for members of the set of blipped trajectories. The readout directions may be based, at least in part, on a readout direction associated with a different member of the set of blipped trajectories. First logic 910 may also be configured to determine membership for the set of blipped trajectories. With so many possible blipped trajectories available, different acquisitions may include different sets of blipped trajectories. In one example, membership in the set may be determined to optimize incoherency. In one example, the incoherency may be optimized for a compressed sensing acquisition. The compressed sensing acquisition may be a two dimensional acquisition.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic. The physical manipulations create a concrete, tangible, useful, real-world result.

It has proven convenient at times, principally for reasons of common usage, to refer to these signals as bits, values, elements, symbols, characters, terms, numbers, and other terms. It should be borne in mind, however, that these and similar terms are to be associated with the appropriate physical quantities and are merely convenient labels applied to these quantities. Unless specifically stated otherwise, it is appreciated that throughout the description, terms including processing, computing, and determining refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 10:
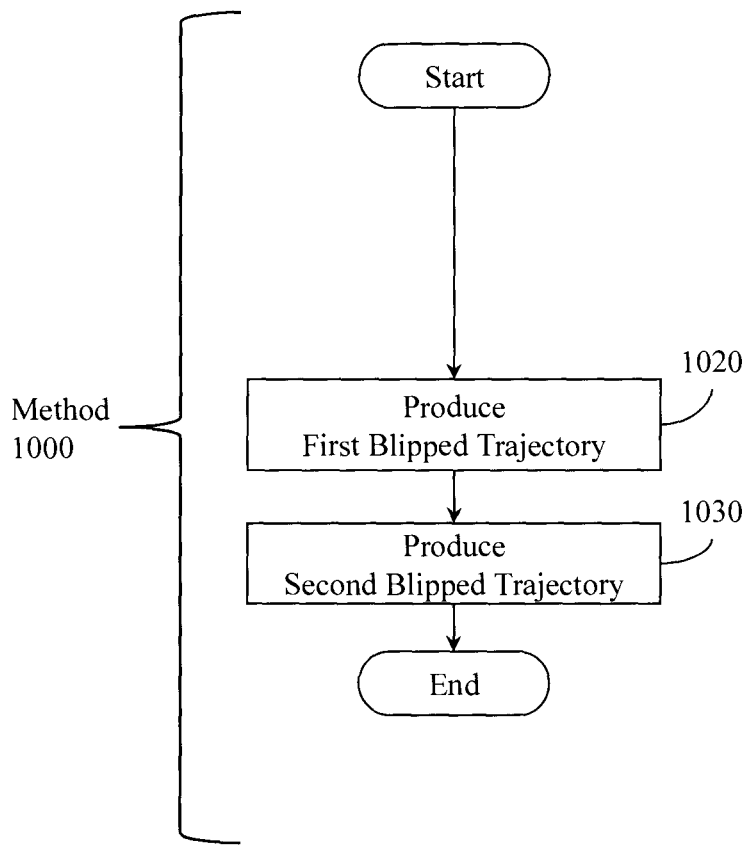
FIG. 10 illustrates a method for producing a set of blipped trajectories.

FIG. 10 illustrates a method 1000 associated with producing a set of blipped trajectories. Method 1000 includes, at 1020, controlling an MRI apparatus to produce a first blipped trajectory having a first blip amplitude, and, at 1030, controlling the MRI apparatus to produce a second, different blipped trajectory having a second, different blip amplitude. As described above, the blip amplitudes may be varied intentionally to facilitate optimizing incoherent sampling in MRI. In one example, the blipped trajectories may be adaptations of radial projections. While radial projections are described, other projections and trajectories may also be adapted.

In one embodiment, the first blip amplitude may be determined based, at least in part, on a first relationship between the first blipped trajectory and a reference line. While a reference "line" is described, in different examples a reference point or other reference location or structure may be employed. Similarly, the second blip amplitude may be based, at least in part, on a second, different relationship between the second blipped trajectory and the reference line. The relationships may be, for example, a rotation angle φ between a blipped trajectory and a reference line. Different reference lines may be used in different embodiments. Different reference lines can include, but are not limited to, a fastest gradient trajectory through a sample space, a slowest gradient trajectory through the sample space, or other reference lines or points.

In another embodiment, the amplitudes may be determined by a portion of k-space to be sampled. For example, a first region may be sampled by a blipped trajectory having a first blip amplitude while a second region may be sampled by a blipped trajectory having a second blip amplitude.

In one embodiment, method 1000 may include driving the gradient system to operate at or near its limits. Thus, in one example, method 1000 may include controlling the gradient system to operate at slew rates up to 80% of maximum, up to 90% of maximum, and even up to a maximum slew rate. Similarly, method 1000 may include controlling the gradient system to produce gradient fields whose strength is up to 80% of maximum, up to 90% of the maximum, and up to the maximum gradient strength.

Blipped trajectories may be employed with different types of acquisitions. The acquisitions can include, for example, a compressed sensing acquisition. Thus, in one example, method 1000 can include controlling an MRI apparatus to perform a compressed sensing acquisition using the set of variable amplitude blipped trajectories. In different examples, the acquisition may be a two dimensional acquisition or a three dimensional acquisition. When used with the two dimensional compressed sensing acquisition, method 1000 will produce a greater degree of incoherent sampling than would be produced if trajectories with constant amplitudes were used.

Figure 11:
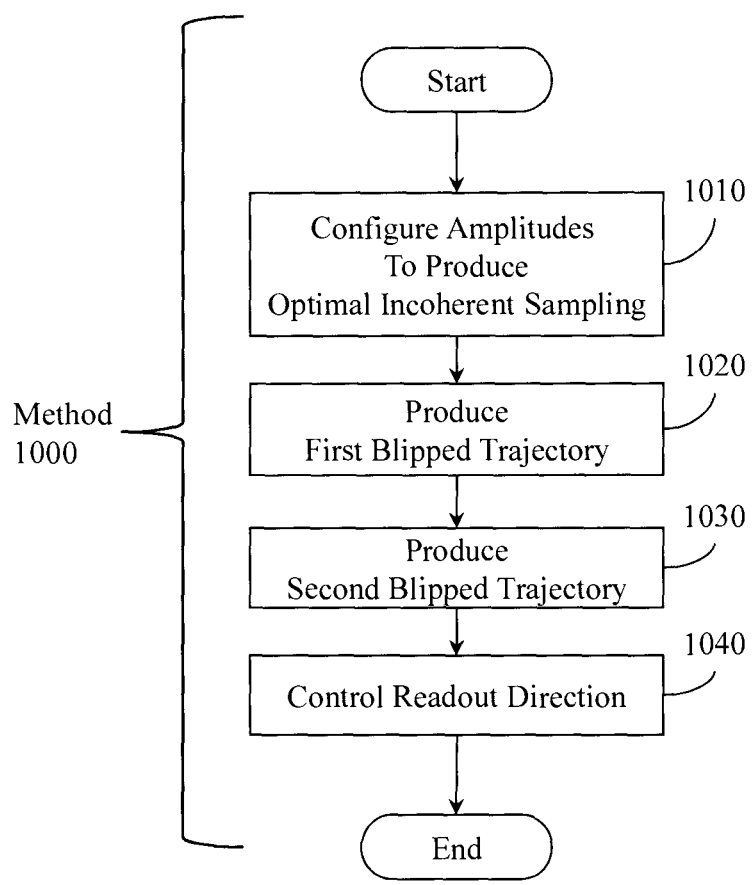
FIG. 11 illustrates a method for producing a set of blipped trajectories.

FIG. 11 illustrates another embodiment of method 1000 (FIG. 10). This embodiment includes actions 1020 and 1030. However, this embodiment also includes actions 1010 and 1040. These actions are configured to further reduce regularity in k-space or to produce a higher degree of incoherent sampling than is possible in conventional systems.

As described above, in different embodiments the amplitudes may be varied as a function of rotation angle, gradient trajectory speed, unused gradient energy, k-space region being sampled, or other parameters. Thus, this embodiment of method 1000 may also include, at 1010, configuring the first blip amplitude and the second blip amplitude to produce optimal incoherent sampling during a two dimensional acquisition performed according to the set of blipped trajectories. In different embodiments, method 1000 may include determining the amplitudes to produce a desired level of incoherency during an MRI acquisition.

Action 1040 may involve controlling the MRI apparatus to associate a first readout direction with the first blipped trajectory and to associate a second, different readout direction with the second blipped trajectory. For example, a first blipped trajectory may proceed in a first direction and then a subsequent blipped trajectory may proceed in an opposite direction. Performing the acquisition using the different readout directions will produce less regularity in k-space than would be produced by performing the acquisition using just one first readout direction for all the trajectories. While an opposite direction is described, other differences in trajectory directions may be employed.

Figure 12:
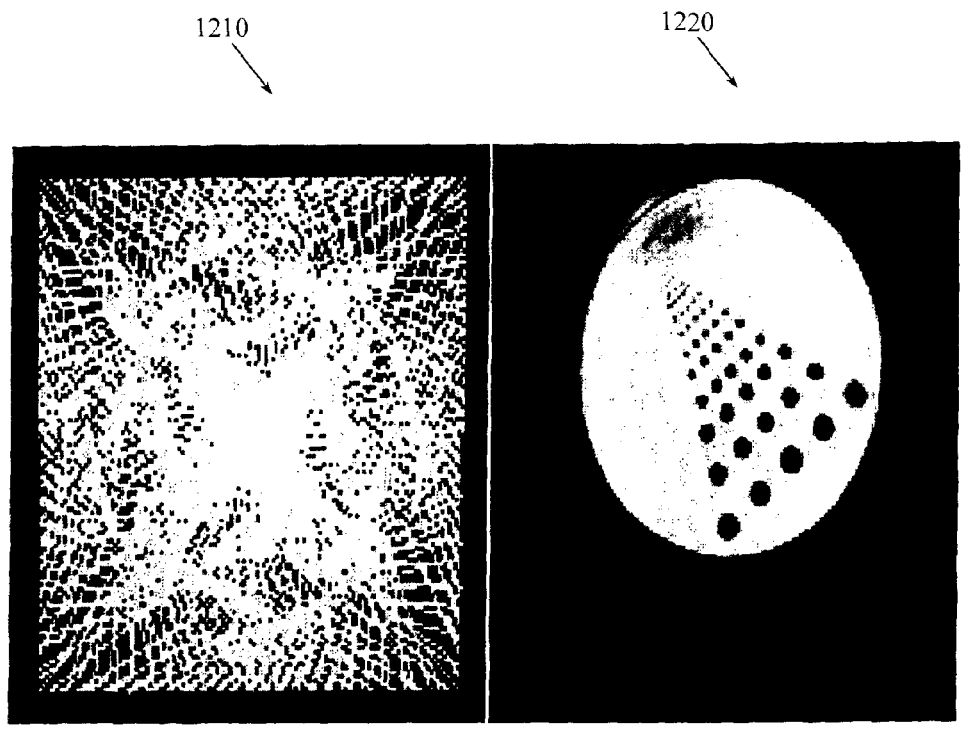
FIG. 12 illustrates a zigzag trajectory and a resulting image.
Figure 13:
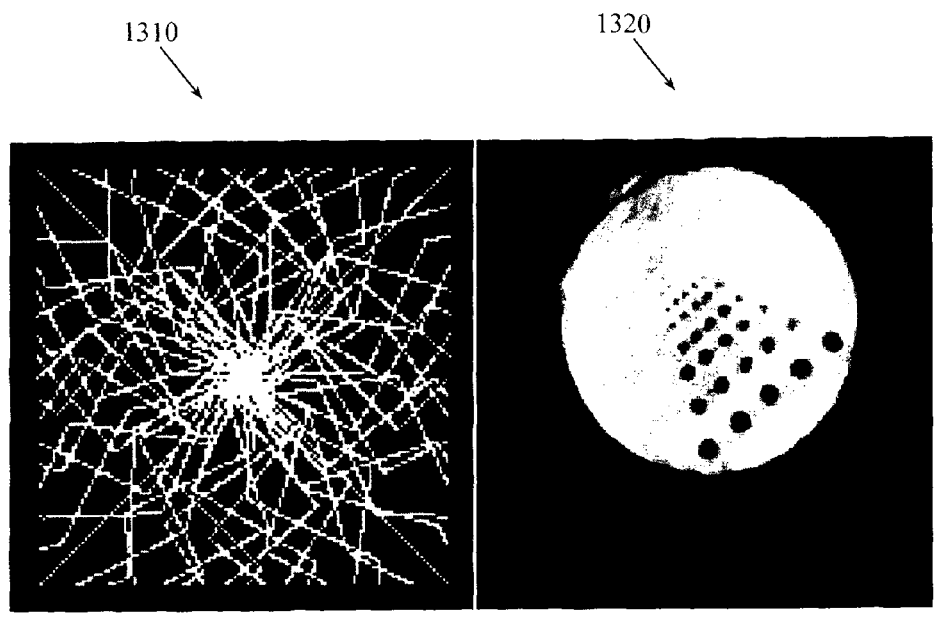
FIG. 13 illustrates a zigzag trajectory and a resulting image.
Figure 14:
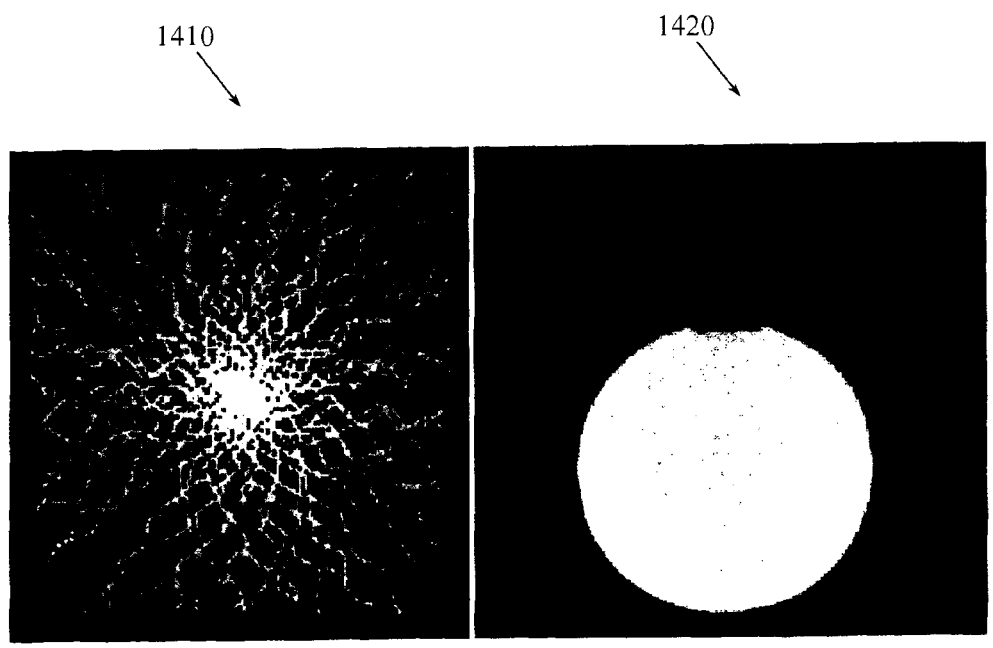
FIG. 14 illustrates a zigzag trajectory and a resulting image.
Figure 15:
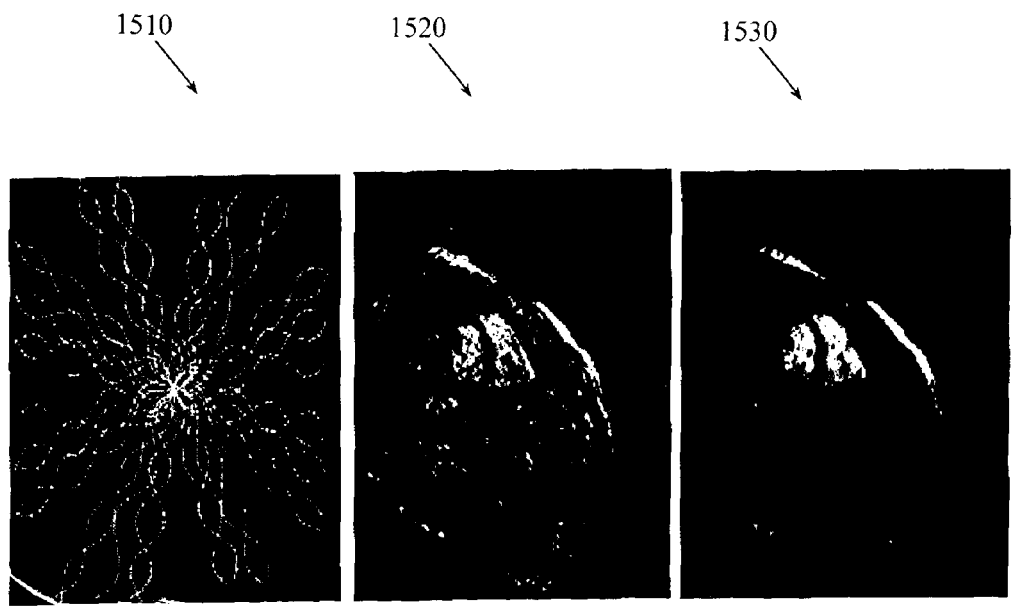
FIG. 15 illustrates a zigzag trajectory with twenty projections acquired in 80 ms, a gridding result, and a final compressed sensing reconstruction.

FIG. 12 illustrates a zigzag trajectory 1210 and a resulting image 1220. FIG. 13 illustrates a different zigzag trajectory 1310 and a resulting image 1320. FIG. 14 illustrates yet another zigzag trajectory 1410 and a resulting image 1420. FIG. 15 illustrates a trajectory with twenty projections acquired in 80 ms, a gridding result, and a final compressed sensing reconstruction. Note how under-sampling artifacts in the images are incoherent with the object and thus appear as noise.

While example systems, methods, and other embodiments have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium", as used herein, refers to a non-transitory medium that stores instructions and/or data. A computer-readable medium may take forms, including, but not limited to, non-volatile media, and volatile media. Non-volatile media may include, for example, optical disks, magnetic disks, and other disks. Volatile media may include, for example, semiconductor memories, dynamic memory, and other memories. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and other devices. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"User", as used herein, includes but is not limited to one or more persons, software, computers or other devices, or combinations of these.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use, See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A computer-implemented method performed by a computer controlling a magnetic resonance imaging (MRI) apparatus and producing variable blipped trajectories during an MRI acquisition, comprising:
the computer controlling the magnetic resonance imaging (MRI) apparatus in order to produce and apply a set of blipped trajectories, during an MRI acquisition where the set of blipped trajectories includes:
a first blipped trajectory having a first blip amplitude, and
a second, different blipped trajectory having a second, different blip amplitude;
and
the computer controlling the MRI apparatus to associate a first readout direction with the first blipped trajectory and controlling the MRI apparatus in order to associate a second, different readout direction with the second blipped trajectory,
where performing the MRI acquisition using the first readout direction for the first blipped trajectory and using the second readout direction for the second blipped trajectory produces less regularity in k-space than is produced by performing the MRI acquisition using the first readout direction as both the first blipped trajectory and the second blipped trajectory, and
where performing the MRI acquisition using the first blip amplitude and the second blip amplitude produces an optimal incoherent sampling during the MRI acquisition.

2. The computer-implemented method of claim 1, where the first blip amplitude is based, at least in part, on a first relationship between the first blipped trajectory and a reference and where the second blip amplitude is based, at least in part, on a second, different relationship between the second blipped trajectory and the reference.

3. The computer-implemented method of claim 2, where the first blipped trajectory and the second blipped trajectory are based on radial trajectories.

4. The computer-implemented method of claim 2, where the first relationship is a rotation angle $\phi_1$ between the first blipped trajectory and the reference and where the second relationship is a rotation angle $\phi_2$ between the second blipped trajectory and the reference.

5. The computer-implemented method of claim 2, where the reference is one of, a fastest gradient trajectory through a sample space, and a slowest gradient trajectory through the sample space.

6. The computer-implemented method of claim 1, where the first blip amplitude is based, at least in part, on a first portion of k-space being sampled by the first blipped trajectory and where the second blip amplitude is based, at least in part, on a second different portion of k-space being sampled by the second blipped trajectory.

7. The computer-implemented method of claim 1, where controlling the MRI apparatus in order to produce the set of blipped trajectories includes controlling a gradient system in the MRI apparatus in order to perform one or more of:
operating the gradient system at a maximum slew rate possible for the gradient system, and
producing with the gradient system a maximum gradient strength possible for the gradient system.

8. The computer-implemented method of claim 1, where the computer controlling the MRI apparatus in order to produce the set of blipped trajectories includes controlling a gradient system in the MRI apparatus in order to:
operate the gradient system with a slew rate of at least 90% of the maximum slew rate, or
produce with the gradient system a gradient strength of at least 90% of the maximum possible gradient strength.

9. The computer-implemented method of claim 1, comprising: the computer controlling the MRI apparatus in order to control a compressed sensing acquisition while using the set of blipped trajectories.

10. The computer implemented method of claim 9, with the compressed sensing acquisition being a two dimensional acquisition and the set of blipped trajectories comprising radial trajectories.

11. The computer-implemented method of claim 1, comprising:
the computer controlling the MRI apparatus to control a two dimensional MRI acquisition to use the set of blipped trajectories, or
the computer controlling the MRI apparatus in order to control a three dimensional MRI acquisition while using the set of blipped trajectories.

12. The computer-implemented method of claim 1, comprising: the computer controlling the MRI apparatus in order to produce the first blipped trajectory having a first blip amplitude at a first location in the first blipped trajectory and having a different blip amplitude at a different location in the first blipped trajectory.

13. The computer-implemented method of claim 12, where the blip amplitude is varied throughout the first blipped trajectory based on a relationship between a portion of the first blipped trajectory and a reference, a relationship between a portion of the second blipped trajectory and a reference, a relationship between a portion of the first blipped trajectory and a region of k-space that is to be sampled, a gradient speed associated with the portion of the first blipped trajectory, or an amount of unused gradient energy associated with the portion of the first blipped trajectory.

14. A magnetic resonance imaging (MRI) apparatus, comprising:
a first logic that controls a gradient system in the MRI apparatus in order to produce a set of varying or variable blipped trajectories, that is used with an MRI acquisition, where the set of blipped trajectories includes at least a first blipped trajectory having a first blip amplitude and a second blipped trajectory having a second, different blip amplitude, where the first logic is a circuit;
where controlling the gradient system in order to produce the set of blipped trajectories includes determining a blip amplitude for a member of the set of blipped trajectories as a function of a gradient trajectory speed associated with the member of the set of blipped trajectories, or an amount of unused gradient energy available while producing the member of the set of blipped trajectories;
a second logic that controls an acquisition system in the MRI apparatus in order to acquire nuclear magnetic resonance (NMR) signals produced in response to nuclear magnetic resonance excitation created in an object that are subjected to the set of blipped trajectories, where the second logic is a circuit; and
a third logic that produces an image from the NMR signals, where the third logic is a circuit.

15. MRI apparatus of claim 14, where controlling the gradient system in order to produce the set of blipped trajectories includes:
determining a readout direction of a member of the set of blipped trajectories based, at least in part, on a readout direction associated with a different member of the set of blipped trajectories.

16. The MRI apparatus of claim 14, where controlling the gradient system in order to produce the set of blipped trajectories includes:
determining membership of the set of blipped trajectories as a function of optimizing incoherency in a compressed sensing acquisition.

* * * * *

UNITED STATES PATENT AND TRADEMARK OFFICE
CERTIFICATE OF CORRECTION

PATENT NO. : 9,069,050 B2  
APPLICATION NO. : 13/444887  
DATED : June 30, 2015  
INVENTOR(S) : Duerk et al.

Page 1 of 1

It is certified that error appears in the above-identified patent and that said Letters Patent is hereby corrected as shown below:

In the Specification:

In the Background of the Invention:

In column 1, line 5, delete "been, tried," and insert --been tried,--.

In the Claims:

In column 12, line 64, delete "computer implemented" and insert --computer-implemented--.

Signed and Sealed this  
First Day of March, 2016

Michelle K. Lee  
*Director of the United States Patent and Trademark Office*